(12) United States Patent
Kramer (10) Patent No.: US 7,535,113 B2
(45) Date of Patent: May 19, 2009

(54) REDUCED INDUCTANCE IN BALL GRID ARRAY PACKAGES

(75) Inventor: Allen N. Kramer, Hudson, WI (US)

(73) Assignee: Seagate Technology LLC, Scotts Valley, CA (US)

( * ) Notice: Subject to any disclaimer, the term of this patent is extended or adjusted under 35 U.S.C. 154(b) by 0 days.

(21) Appl. No.: 12/187,092

(22) Filed: Aug. 6, 2008

(65) Prior Publication Data

US 2008/0296766 A1    Dec. 4, 2008

Related U.S. Application Data

(62) Division of application No. 11/187,565, filed on Jul. 22, 2005, now Pat. No. 7,420,286.

(51) Int. Cl.
*H01L 23/48* (2006.01)
*H01L 23/52* (2006.01)

(52) U.S. Cl. .................... 257/784; 257/786; 257/773; 257/698; 257/E23.024

(58) Field of Classification Search .............. 257/784, 257/698, 773, 786, E23.024
See application file for complete search history.

(56) References Cited

U.S. PATENT DOCUMENTS

| 5,592,025 | A | 1/1997 | Clark et al. |
| 5,691,568 | A | 11/1997 | Chou et al. |
| 5,726,860 | A | 3/1998 | Mozdzen |
| 5,895,967 | A * | 4/1999 | Stearns et al. ............... 257/691 |
| 6,064,113 | A * | 5/2000 | Kirkman ..................... 257/691 |
| 6,323,065 | B1 | 11/2001 | Karnezos |
| 6,566,761 | B1 | 5/2003 | Sharma et al. |
| 6,574,108 | B1 | 6/2003 | Kramer et al. |
| 6,667,546 | B2 | 12/2003 | Huang et al. |
| 6,879,039 | B2 | 4/2005 | Khan et al. |
| 6,888,240 | B2 | 5/2005 | Towle et al. |
| 6,897,555 | B1 | 5/2005 | Lim et al. |
| 2003/0075812 | A1 | 4/2003 | Cheng et al. |
| 2003/0089983 | A1 | 5/2003 | Huang et al. |
| 2003/0111726 | A1* | 6/2003 | Khan et al. ................. 257/730 |
| 2004/0113252 | A1 | 6/2004 | Vonstaudt |
| 2004/0195703 | A1* | 10/2004 | Lane et al. .................. 257/784 |

* cited by examiner

*Primary Examiner*—Nitin Parekh
(74) *Attorney, Agent, or Firm*—David K. Lucente (57) ABSTRACT

Techniques are described for reducing inductance in ball grid array (BGA) packages for integrated circuits (ICs). The BGA package comprises a set of contacts disposed near an outer edge of the BGA package that receives signal lines and isolated power and ground lines. One area of excess parasitic inductance within the BGA package is in the wire bonds that couple the set of contacts to the IC. The techniques described herein shorten the wire bonds in order to reduce the amount of parasitic inductance. The techniques include extending traces from a subset of the contacts inward into the BGA package toward the IC mounted. The wire bonds then couple the traces to the IC, thereby electrically coupling the subset of contacts to the IC. The presence of the traces substantially reduces lengths of the wire bonds relative to wire bonds that directly couple the set of contacts to the IC.

2 Claims, 8 Drawing Sheets

REDUCED INDUCTANCE IN BALL GRID ARRAY PACKAGES

This application is a divisional of U.S. application Ser. No. 11/187,565, filed Jul. 22, 2005, the entire contents of which are incorporated herein by reference.

TECHNICAL FIELD

The invention relates to integrated circuit packages and, more specifically, reducing inductance in integrated circuit packages.

BACKGROUND

Integrated circuits (ICs) for controlling electronic devices, such as disk drives, are typically cut from silicon wafers and packaged so that they can be electrically attached to circuitry of a printed circuit board (PCB). The top surface of the PCB typically includes electrical contacts to which terminals of the IC package may be connected. As technology moves forward, ICs are designed to carry out more functions of greater complexity. As a result, the number of electrical contact points for power supply and input/output (I/O) signals to and from ICs continues to increase. IC packages that can handle an increased number of electrical contact points are therefore required. Ball grid array (BGA) packages, which utilize solder balls on their mounting surfaces instead of pins for mounting to PCB contacts, are especially useful because they allow for more contacts per unit package area.

One of the major factors that limit the performance of data storage devices, such as disc drives, is the speed at which digital data can be communicated between the drive and another device, such as a computer bus. One of the ways to increase total speed is to transmit more data bits in parallel. Protocols such as SCSI (small computer system interface), wide SCSI, and ultra wide SCSI have taken this route to the point where data synchronization and the shear physical size of the cables limit further gains. Recent interest has focused upon the opposite extreme: single-bit serial communications at base data rates in the ultrahigh and extremely high frequency range. For example, high-speed differential signals, including Fiber Channel signals or other serial signals such as Serial Attached SCSI (SAS) signals or Serial Advanced Technology Attachment (SATA) signals, propagate data at speeds of 4.25 Gbit/s and above.

Successful transmission of high-speed differential signals to and from ICs within data storage devices requires low-loss transmission lines with minimal parasitic inductance and capacitance. In a BGA package, wire bonds electrically couple a set of signal contacts disposed near an outer edge of the BGA package to an IC mounted on the BGA package. The long wire bonds used to transmit high-speed differential signals between the BGA package and the IC include excess parasitic inductance that may reduce the quality and signal edge rate of the high-speed differential signals. High performance packages may use flip chip attachments to reduce this parasitic effect. However, the flip chip technique is more expensive than wire bonding and is not a viable solution for cost sensitive applications.

Furthermore, some storage device ICs may include an analog circuit that requires isolated connectivity of the power and ground bus to reduce noise in the analog circuit from the rest of the circuits in the IC. For example, connecting analog power to common BGA package power rings may substantially increase an amount of noise in the analog circuit of the IC. Therefore, an analog circuit of the IC may connect to external power through a set of isolated power contacts located near an edge of a BGA package. However, since long bond wires are used to couple the set of power contacts to the IC, the isolation of these analog connections results in more inductance in the BGA package interconnects. The inductance within the wire bonds may also lead to higher noise on the IC due to activity in the analog circuit as transient power supply voltage noise amplitude is proportional to inductance, i.e., $V=-L*(di/dt)$.

SUMMARY

In general, the invention is directed to techniques for reducing inductance in ball grid array (BGA) packages for integrated circuits (ICs). A BGA package electrically couples an IC mounted on the BGA package to a printed circuit board (PCB). The BGA package comprises a set of contacts disposed near an outer edge of the BGA package that receives signal lines and isolated power and ground lines. One area of excess parasitic inductance within the BGA package is in the wire bonds that couple the set of contacts to the IC. Unlike typical transmission lines where inductance and capacitance is distributed resulting in a fixed known impedance, inductance and capacitance cannot be controlled along the length of the wire bonds. The techniques described herein shorten the wire bonds in order to reduce the parasitic inductance within the wire bonds and extend the region of controllable transmission line length inside the BGA.

The techniques include extending traces from a subset of the contacts inward into the BGA package toward the IC mounted on the BGA package. The wire bonds then couple the traces to the IC, thereby electrically coupling the subset of contacts to the IC. The presence of the extended traces substantially reduces lengths of the wire bonds relative to conventional wire bonds that directly couple the set of contacts to the IC.

In conventional BGA packages, longer wire bonds are used to couple high-speed differential signal lines, such as Fiber Channel, to the IC. High inductance within these wire bonds affects the edge rate of the high-speed differential signals. In addition, the IC typically includes at least one analog circuit, such as a serial transceiver. An analog circuit of the IC may couple to external power and ground in order to reduce noise in the analog circuit from the BGA package power and ground rings. However, isolated power and ground contacts are located on the BGA package further from the IC than the power and ground rings. In this case, longer bond wires are also used to couple the isolated power and ground contacts to the analog circuit of the IC.

Since the analog circuit does not connect to the BGA package power and ground rings, the techniques described herein remove a portion of the power rings, and in come cases a portion of the ground ring, in the analog area of the BGA package. Traces can then be extended from the subset of contacts toward the IC into the area of the BGA package where the power and ground rings formerly resided. Since the traces terminate closer to the IC than the set of contacts, the wire bond length is shortened and the parasitic inductance is reduced for both the high-speed differential signals and the power and ground connections.

In one embodiment, the invention is directed to an electrical component comprising a ball grid array package, and an integrated circuit mounted on the ball grid array package. The ball grid array package includes a set of contacts disposed near an outer edge of the ball grid array package, signal traces that extend from a subset of the contacts inward into the ball grid array package toward the integrated circuit mounted on the ball grid array package, and wire bonds that couple the signal traces to the integrated circuit to thereby electrically couple the subset of the contacts to the integrated circuit.

In another embodiment, the invention is directed to a method of manufacturing an electrical component comprising mounting an integrated circuit on a ball grid array package, disposing a set of contacts near an outer edge of the ball grid array package, extending signal traces from a subset of the contacts inward into the ball grid array package toward the integrated circuit mounted on the ball grid array package, and coupling the signal traces to the integrated circuit with wire bonds to thereby electrically couple the subset of the contacts to the integrated circuit. The presence of the signal traces substantially reduces lengths of the wire bonds relative to wire bonds that couple the set of contacts directly to the integrated circuit.

In another embodiment, the invention is directed to a system comprising a printed circuit board, a ball grid array package coupled to the printed circuit board, and an integrated circuit mounted on the ball grid array package. The ball grid array package includes a set of contacts disposed near an outer edge of the ball grid array package, signal traces that extend from a subset of the contacts inward into the ball grid array package toward the integrated circuit mounted on the ball grid array package, and wire bonds that couple the signal traces to the integrated circuit to thereby electrically couple the subset of the contacts to the integrated circuit, wherein the presence of the signal traces substantially reduces lengths of the wire bonds relative to wire bonds that couple the set of contacts directly to the integrated circuit.

The invention may be capable of providing one or more advantages. For example, by shortening the wire bonds between the high-speed differential signal contacts and the IC, the BGA package can achieve the return loss requirements necessary for successful transmission of the high-speed differential signals at 4.25 Gbit/s and above. In other words, reducing parasitic inductance within the wire bonds improves the quality and the edge rate of the high-speed differential signals to and from the IC. Furthermore, shortening the wire bonds between the isolated power and ground contacts and the IC further reduces noise on the IC. For example, reducing the length of the wire bonds by approximately one half may reduce the noise level contributed by the wire bonds on the IC by approximately one half since transient noise is proportional to inductance (i.e., $V=-L*(di/dt)$).

The details of one or more embodiments of the invention are set forth in the accompanying drawings and the description below. Other features, objects, and advantages of the invention will be apparent from the description and drawings, and from the claims.

DETAILED DESCRIPTION

Figure 1:
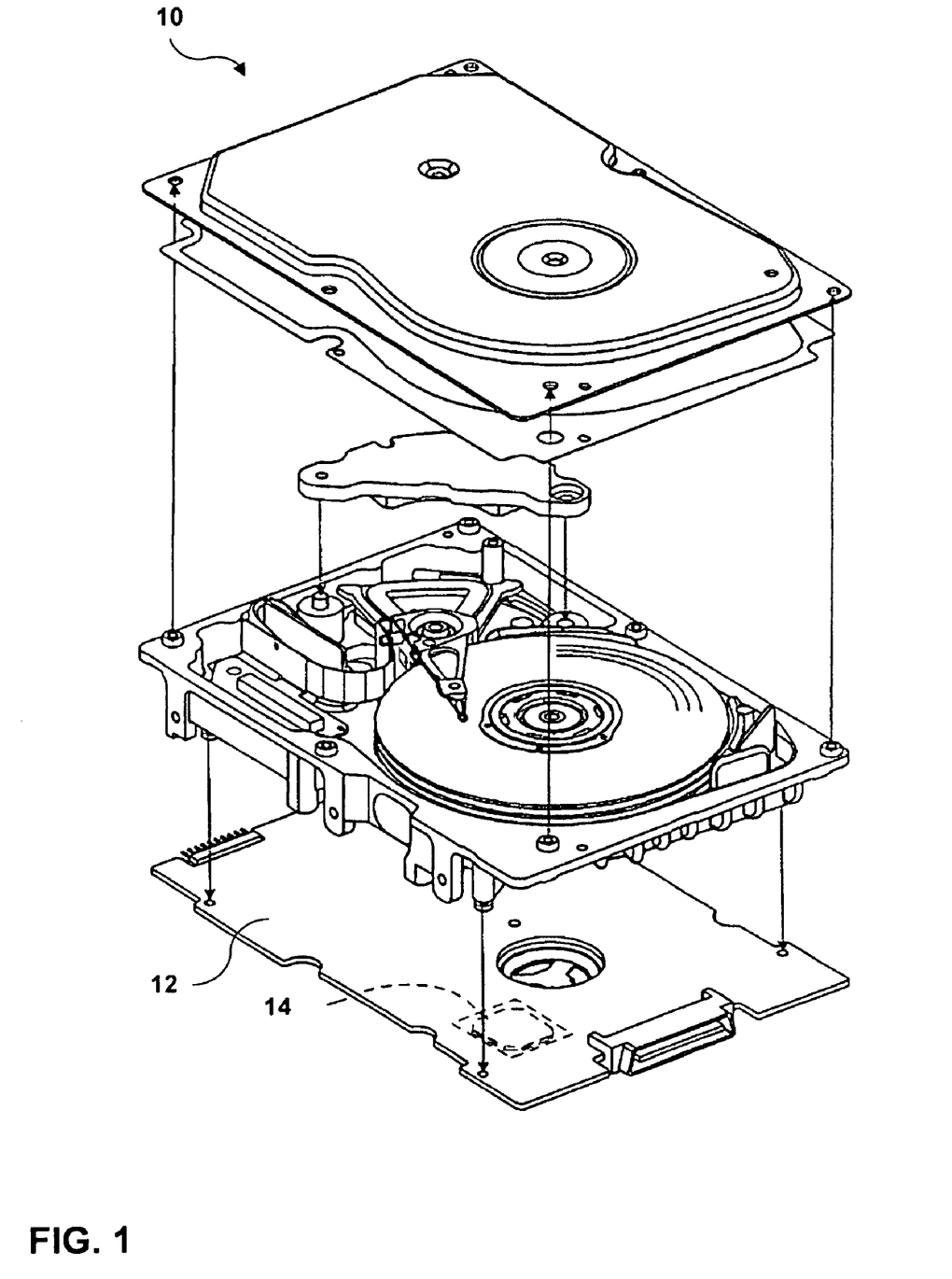
FIG. 1 is an exploded view of an exemplary disc drive.

FIG. 1 is an exploded view of an exemplary disc drive 10. For example, disc drive 10 may comprise a hard disc drive included within a computing device or a standalone hard disc drive that may be purchased from a manufacturer, such as Seagate Technology of Scotts Valley, Calif. Disc drive 10 comprises at least one magnetic transducer to form at least one transducer head. In some cases, disc drive 10 may comprise multiple transducers to form a magnetoresistive (MR) head in which one transducer is used for reading data from a medium and another transducer is used for writing data to a medium.

Disc drive 10 includes a printed circuit board (PCB) 12 and an electrical component 14 mounted on PCB 12. Electrical component 14 may comprise a ball grid array (BGA) package and an integrated circuit (IC) mounted on the BGA package. The IC may comprise a control circuit that controls operation of disc drive 10. The IC of electrical component 14 may include at least one analog circuit, such as a serial transceiver. Besides electrical component 14, disc drive 10 may carry a number of integrated circuit packages. These integrated circuits may perform analog and digital functions such as signal amplification, data formatting, and communication.

The BGA package of electrical component 14 comprises a set of contacts (not shown) that receives signals, such as high-speed differential signals, isolated power, isolated ground, or other I/O (input/output) signals. High-speed differential signals (e.g., Fiber Channel signals or other serial signals such as Serial Attached SCSI (SAS) signals or Serial Advanced Technology Attachment (SATA) signals) require transmission to and from the IC within electrical component 14 through a uniform medium substantially similar to a low-loss transmission line. Therefore, excess parasitic inductance within electrical component 14 is minimized to ensure successful transmission of the high-speed differential signals at 4.25 Gbit/s and above.

One area of excess parasitic inductance within electrical component 14 is in the wire bonds that couple the set of contacts disposed near an outer edge of the BGA package to the IC. Unlike typical transmission lines where inductance and capacitance is distributed resulting in a fixed known impedance, inductance and capacitance cannot be controlled along the length of the wire bonds. In accordance with an embodiment of the invention, electrical component 14 includes shortened bond wires in order to reduce the parasitic inductance within the wire bonds. As described in more detail below, traces may be extended from a subset of the contacts inward into the BGA package toward the IC mounted on the BGA package. The wire bonds then couple the traces to the IC, thereby electrically coupling the subset of contacts to the IC.

The presence of the extended traces substantially reduces lengths of the wire bonds relative to conventional wire bonds that directly couple the set of contacts to the IC. For example, conventional wire bonds may comprise lengths of approximately 160 mils, and conventional signal traces may comprise lengths between approximately 200 mils and 300 mils. In one embodiment of the BGA package described herein, the shortened wire bonds may comprise lengths of less than approximately 90 mils, more preferably less than approximately 80 mils, and the extended signal traces may comprise lengths between approximately 280 mils and 380 mils. In another embodiment, the shortened wire bonds may comprise lengths of less than approximately 70 mils, more preferably less than approximately 60 mils, and the extended signal traces may comprise lengths between approximately 300 mils and 400 mils.

Figure 2:
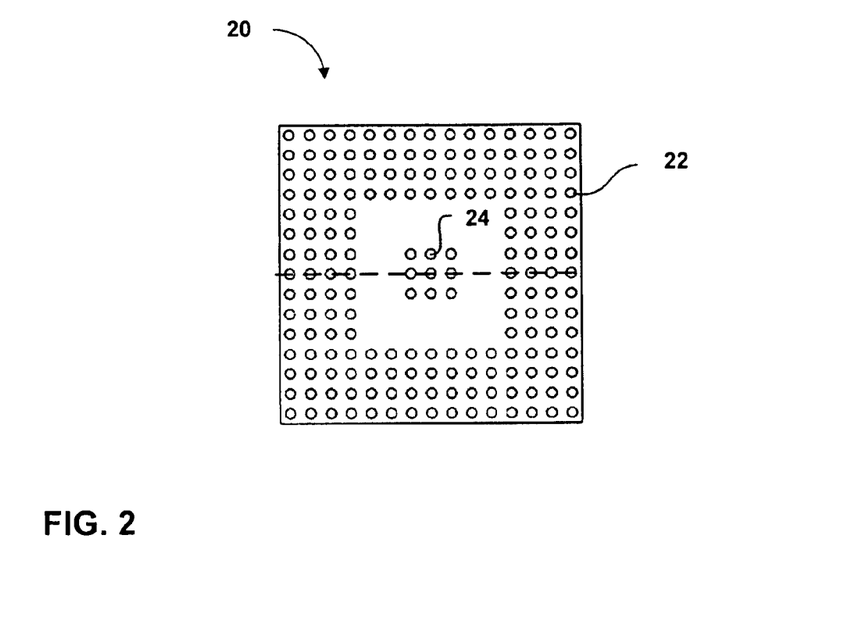
FIG. 2 illustrates a mounting surface of an exemplary ball grid array (BGA) package for mounting the BGA package to contacts on a printed circuit board (PCB).

FIG. 2 illustrates a mounting surface of an exemplary BGA package 20 for mounting BGA package 20 to contacts on a PCB. An IC may be mounted on a surface of BGA package 20 opposite the mounting surface shown. An electrical component, such as electrical component 14 from FIG. 1, may utilize BGA package 20 to connect an IC to a PCB. BGA package 20 includes peripheral solder balls 22 and central solder balls 24. In other embodiments, the solder balls 22 and 24 may be arranged in different patterns. Wire bonds and traces electrically couple an IC mounted on BGA package 20 to solder balls 22 and 24. In turn, solder balls 22 and 24 electrically couple BGA package 20 to mounting contacts on a PCB, thereby electrically coupling the IC to the PCB.

In some cases, central solder balls 24 may comprise thermal balls. Peripheral solder balls 22 are primarily signal balls, or I/O balls. When BGA package 20 is applied to the PCB, central solder balls 24 are connected to vias, which are in turn connected to a preexisting heat sink layer of the PCB. Furthermore, peripheral solder balls 22 are connected to signal vias, which are in turn connected to signal layers of the PCB. Some of solder balls 22 and 24 may be connected to vias, which are connected to the power and ground planes of the PCB.

Figure 3:
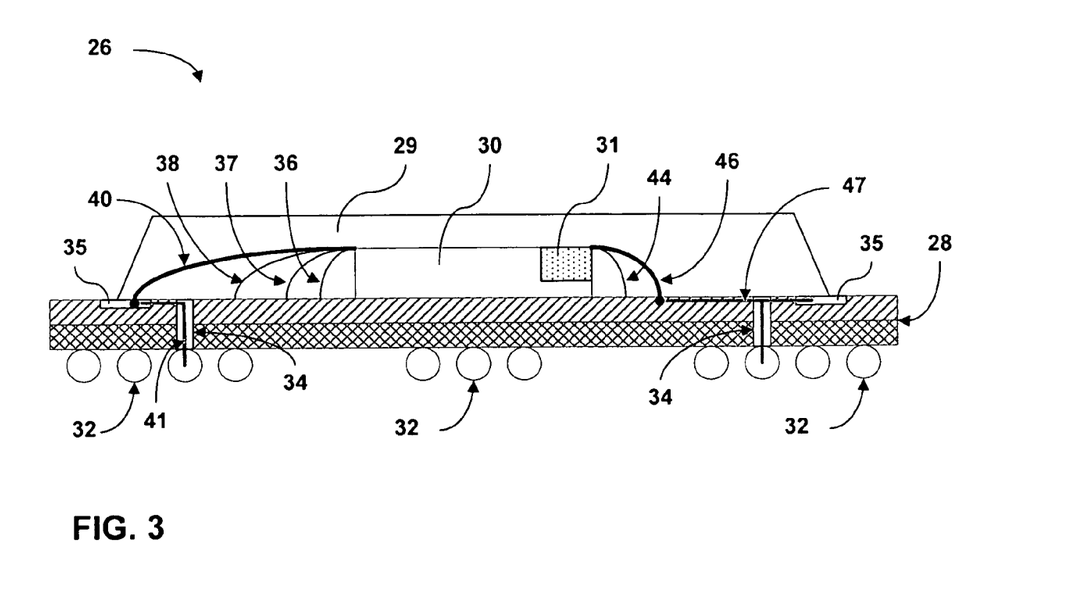
FIG. 3 illustrates a cross-sectional view of an exemplary electrical component in accordance with the invention.

FIG. 3 illustrates a cross-sectional view of an exemplary electrical component 26 in accordance with the invention. Electrical component 26 comprises an IC 30 mounted on a BGA package 28. Electrical component 26 also includes an overmold 29, which encloses IC 30 and its associated connections adjacent BGA package 28. Electrical component 26 may operate substantially similar to electrical component 14 of FIG. 1. In the illustrated embodiment, IC 30 comprises an analog circuit 31, such as a serial transceiver, that requires isolated power and ground connections to reduce noise on analog circuit 31 from other circuits of IC 30.

In the illustrated embodiment, BGA package 28 includes a dual-layer substrate. In this way, IC 30 may be mounted on a first substrate layer of BGA package 28 and solder balls 32 may be mounted on a second substrate of BGA package 28. The two substrate layers are connected by vias 34 such that traces may electrically couple IC 30 to solder balls 32. As described above in reference to FIG. 2, solder balls 32 connect BGA package 28 to mounting contacts on a PCB, thereby electrically coupling IC 30 to the PCB. In some cases, solder balls 32 located below IC 30 may be thermal balls. As a result, they advantageously serve to conduct heat away from IC 30 into a heat sink layer of a PCB, so as to allow the heat to spread through the heat sink layer away from IC 30.

BGA package 28 also includes a set of contacts 35 disposed near an outer edge of BGA package 28. The set of contacts 35 is capable of receiving high-speed differential signal lines, isolated power lines, isolated ground lines and other I/O signal lines. The set of contacts 35 is connected to solder balls 32 by traces that travel through vias 34 from one of contacts 35 to one of solder ball 32.

Wire bonds couple IC 30 to the set of contacts 35 as well as to ground and power strips internal to BGA package 28. In the embodiment illustrated in FIG. 3, wire bond 36 couples a ground of IC 30 to a ground ring, and wire bonds 37 and 38 respectively couple a first power and a second power of IC 30 to a first power ring and a second power ring. Wire bond 40 may carry an I/O signal. Wire bond 40 couples IC 30 to one of contacts 35. In turn, signal trace 41 connects the one of contacts 35 to one of solder balls 32.

As can be seen in FIG. 3, the longest wire bonds are used to couple IC 30 to the set of contacts 35 disposed near an outer edge of a BGA package. As the length of wire bonds increases, the amount of excess parasitic inductance present within the wire bonds also increases. Unlike typical transmission lines where inductance and capacitance is distributed resulting in a fixed known impedance, the parasitic inductance along the length of the wire bonds cannot be controlled. Therefore, the wire bonds with lengths capable of spanning between IC 30 and the set of contacts 35 on the BGA package include undesired parasitic inductance. Excess inductance is especially detrimental within wire bonds that carry high-speed differential signals, such as Fiber Channel signals. The excess parasitic inductance may substantially affect the edge rate of the high-speed differential signals.

In conventional BGA packages, a wire bond, substantially similar to wire bond 40, may be used to transmit high-speed differential signals between analog circuit 31 and the set of contacts 35. In addition, analog circuit 31 requires isolated power and ground connections. Therefore, wire bonds may also be used to couple power and ground of analog circuit 31 to the set of contacts 35 disposed near the edge of BGA package 28 instead of to the power and ground rings internal to BGA package 28. Wire bonds that couple IC 30 to the set of contacts 35 are substantially longer than wire bonds that couple IC 30 to the power and ground rings. Increased parasitic inductance in a wire bond that carries isolated power to analog circuit 31 of IC 30 may increase noise in IC 30 due to activity in analog circuit 31.

As illustrated in FIG. 3, the invention utilizes shortened wire bonds to couple analog circuit 31 of IC 30 to a subset of contacts 35 in order to reduce the parasitic inductance in the wire bonds. Since analog circuit 31 of IC 30 does not use the power and ground rings internal to BGA package 28, a portion of the power rings, and in some cases a portion of the ground ring, may be removed from an area of BGA package 28 substantially adjacent analog circuit 31. Once the portions of the power rings are removed from the analog area of BGA package 28, signal, power, and ground traces may extend from a subset of contacts 35 within the analog area inward into BGA package 28 toward IC 30. In this way, relatively short wire bonds couple analog circuit 31 of IC 30 to traces extended from the subset of contacts 35, thereby electrically coupling IC 30 to the subset of contacts 35.

Wire bond 46 may carry a high-speed differential signal, such as a Fiber Channel signal. In other embodiments, wire bond 46 may carry isolated power or isolated ground. Wire bond 46 couples analog circuit 31 to signal trace 47 extended into BGA package 28 from one of the subset of contacts 35 disposed near an outer edge of BGA package 28. Signal trace 47 connects wire bond 46 to one of contacts 35 and connects the one of contacts 35 to one of solder balls 32. In addition, a wire bond 44 couples a ground of IC 30 to the ground ring. A ground trace may extend from one of the subset of contacts 35 inward into BGA package 28 to the ground ring. In some embodiments, a portion of the ground ring may also be removed in the analog area of BGA package 28. In that case, a ground trace may be extended from IC 30 outward into BGA package 28 toward the subset of contacts 35 and a wire bond may couple the ground trace to analog circuit 31 of IC 30.

By shortening wire bonds between high-speed differential signal contacts and IC 30, BGA package 26 can achieve the return loss requirements necessary for successful transmission of the high-speed differential signals at 4.25 Gbit/s and above. In other words, reducing parasitic inductance within the wire bonds improves the quality and the edge rate of the high-speed differential signals to and from IC 30. Furthermore, shortening the wire bonds between isolated power and ground contacts and IC 30 reduces noise on IC 30. For example, reducing the length of the wire bonds by approximately one half may reduce the noise level contributed by the wire bonds on IC 30 by approximately one half since transient noise is proportional to inductance (i.e., $V=-L*(di/dt)$).

Figure 4:
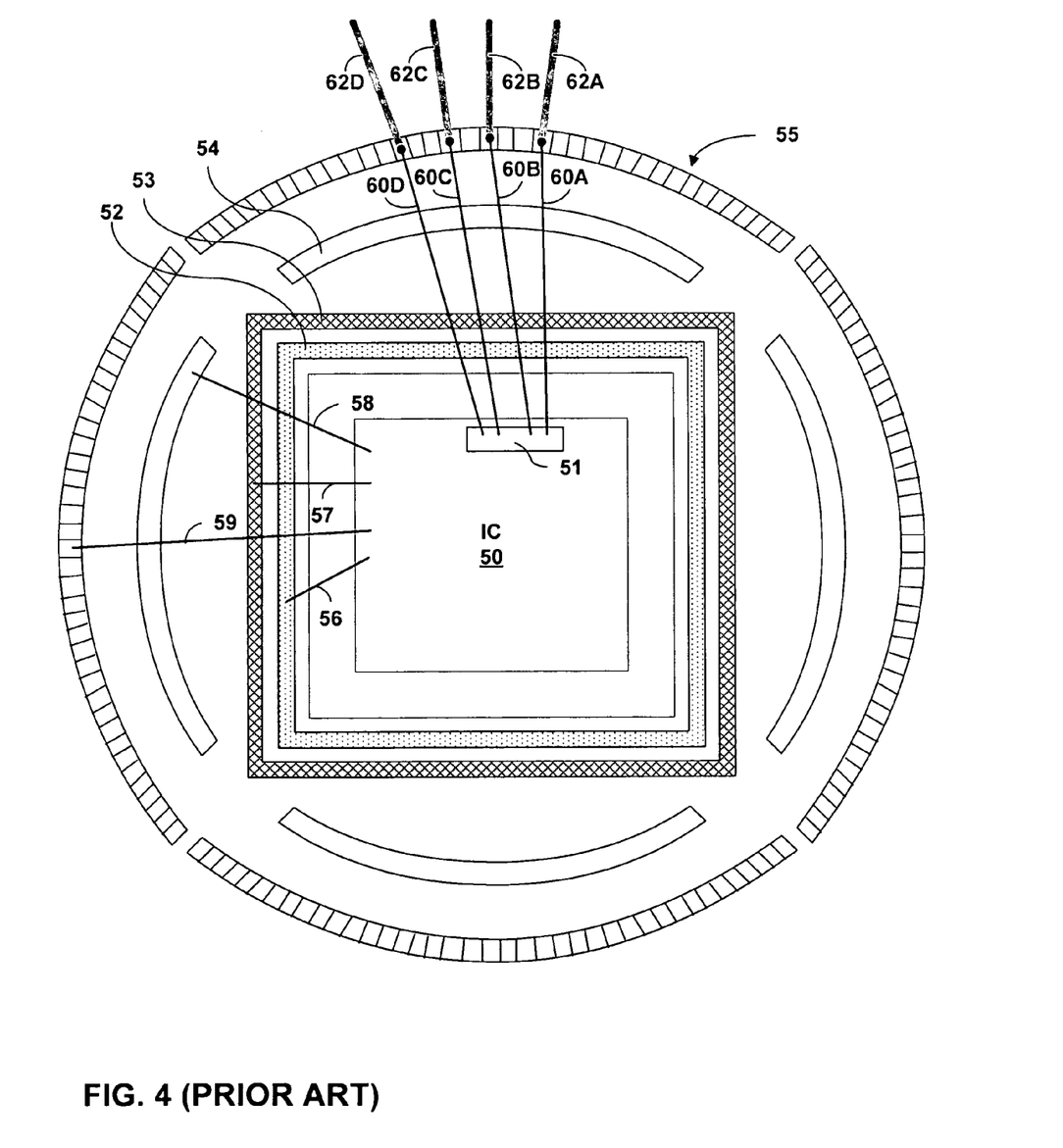
FIG. 4 is a prior art wire bond diagram that illustrates exemplary connections of an integrated circuit (IC) mounted on a conventional BGA package.

FIG. 4 is a prior art wire bond diagram that illustrates exemplary connections of an IC 50 mounted on a conventional BGA package. IC 50 is mounted near a center of the BGA package. IC 50 may comprise a control circuit for an electronic device, such as a disk drive. IC 50 includes an analog circuit 51, which may comprise a serial transceiver.

The BGA package comprises a set of contacts 55 disposed near an edge of the BGA package. The set of contacts 55 may be capable of receiving I/O signal lines, high-speed differential signal lines, isolated power lines, and isolated ground lines. The conventional BGA package also comprises a ground ring 52, a first power ring 53, and a second power ring 54 that substantially completely surround IC 50. First power ring 53 may comprise a voltage level different than a voltage level of second power ring 54. For example, first power ring 53 may comprise a 1.8 volt power ring and second power ring 54 may comprise a 3.3 volt power ring.

In general, wire bonds connect IC 50 to ground ring 52, power rings 53 and 54, and the set of contacts 55, which are in turn connected to solder balls on an opposite surface of the BGA package using traces that travel through vias of the BGA package. The solder balls of the BGA package are connected to contacts on a PCB, thereby electrically coupling IC 50 to the PCB. The PCB contacts connect the BGA package to ground planes, power planes, and signal planes within the PCB.

As illustrated in FIG. 4, wire bond 56 couples a ground of IC 50 to ground ring 56. Wire bond 57 couples a first power connection of IC 50 to first power ring 53 and wire bond 58 couples a second power connection of IC 50 to second power ring 54. Wire bond 59 couples one of contacts 55 to IC 50 and may transmit an I/O signal to and from IC 50. Although not shown in FIG. 4, a wire bond substantially similar to wire bond 59 may couple each of the set of contacts 55 to IC 50. Furthermore, additional wire bonds may couple ground ring 56, first power ring 57, and second power ring 58 to IC 50.

As stated above, IC 50 includes analog circuit 51 that requires isolated power and ground connections. Wire bonds 60A-60D ("wire bonds 60") couple analog circuit 51 of IC 50 to the set of contacts 55. Coupling analog circuit 51 of IC 50 to either first power ring 56 or second power ring 57 introduces noise from other circuits on IC 50 into analog circuit 51. In order to avoid increased noise levels, wire bonds 60 couple the power and ground of analog circuit 51 to the set of contacts 55. The set of contacts 55 receive lines 62A-62D ("lines 62") from other components on the PCB. For example, lines 62A and 62B may comprise high-speed differential signal lines, line 62C may comprise an isolated power line, and line 62D may comprise an isolated ground line.

As can be seen, wire bonds 59 and 60 are substantially longer than wire bonds 56, 57, and 58. As the length of the wire bonds increases, the amount of parasitic inductance within the wire bonds also increases. Therefore, wire bonds 59 and 60 have higher inductance levels than wire bonds 56, 57, or 58. High inductance levels within the wire bonds can affect the quality and the edge rate of the signal propagating through the wire bond. Excess inductance may be especially detrimental to high-speed differential signals transmitted by wire bonds 60 that require propagation at 4.25 Gbit/s and higher for successful transmission. Furthermore, excess inductance within wire bonds 60 carrying isolated power or ground to analog circuit 51 of IC 50 may increase noise on IC 50 due to activity in analog circuit 51.

Figure 5:
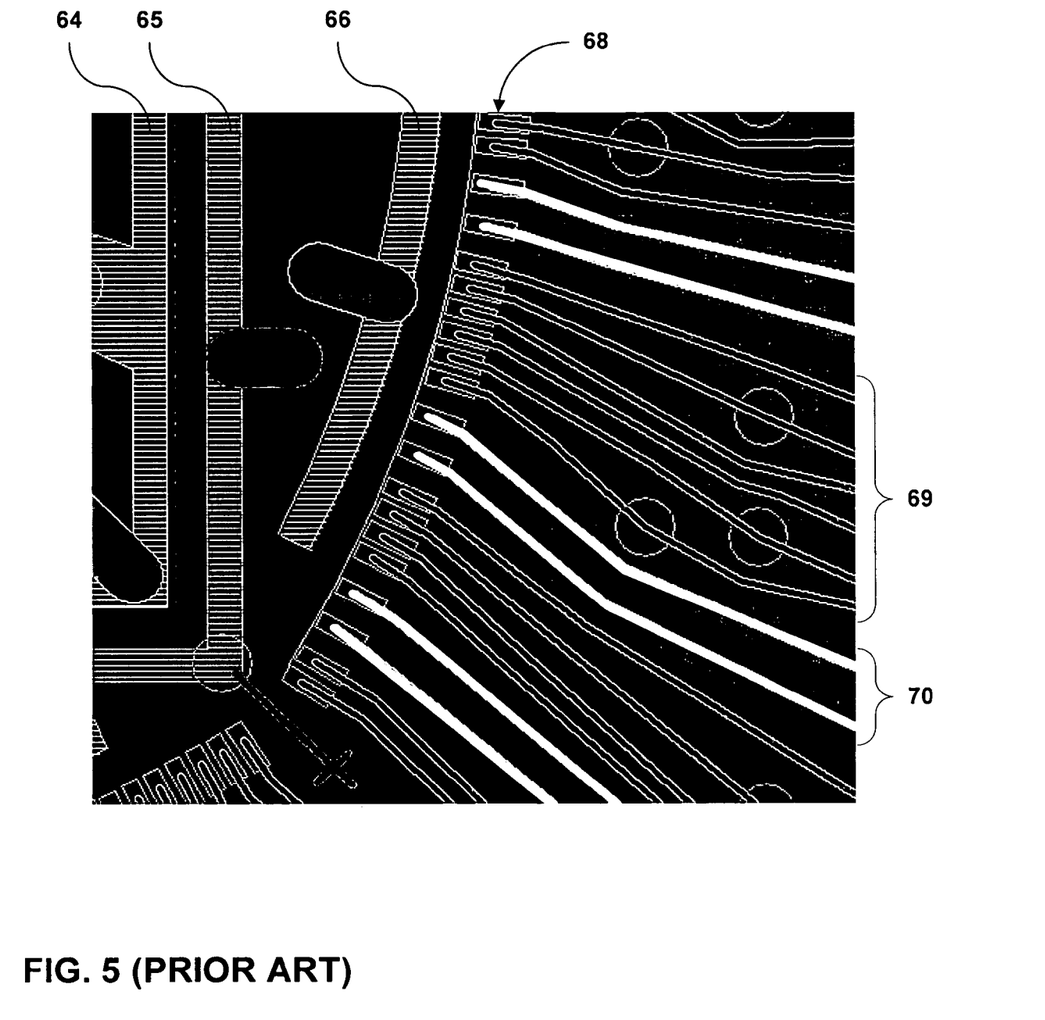
FIG. 5 illustrates a portion of a prior art BGA package.

FIG. 5 illustrates a portion of a prior art BGA package. The prior art BGA package comprises a ground ring 64, a first power ring 65, a second power ring 66, and a set of contacts 68. In the illustrated embodiment, the portion of the BGA package comprises an analog area of the BGA package substantially adjacent an analog circuit included in an IC (not shown) mounted on the BGA package.

A subset of signal contacts 68 receive high-speed differential signal lines 70 and another subset of signal contacts 68 receive isolated power and ground lines 69. Lines 69 may also comprise other I/O signal lines. Wire bonds (not shown) are used to connect each of the set of contacts 68 to the IC mounted on the BGA package. Wire bonds may not couple the IC to any of ground ring 64, first power ring 65, and second power ring 66 within the analog area illustrated in FIG. 5.

Figure 6:
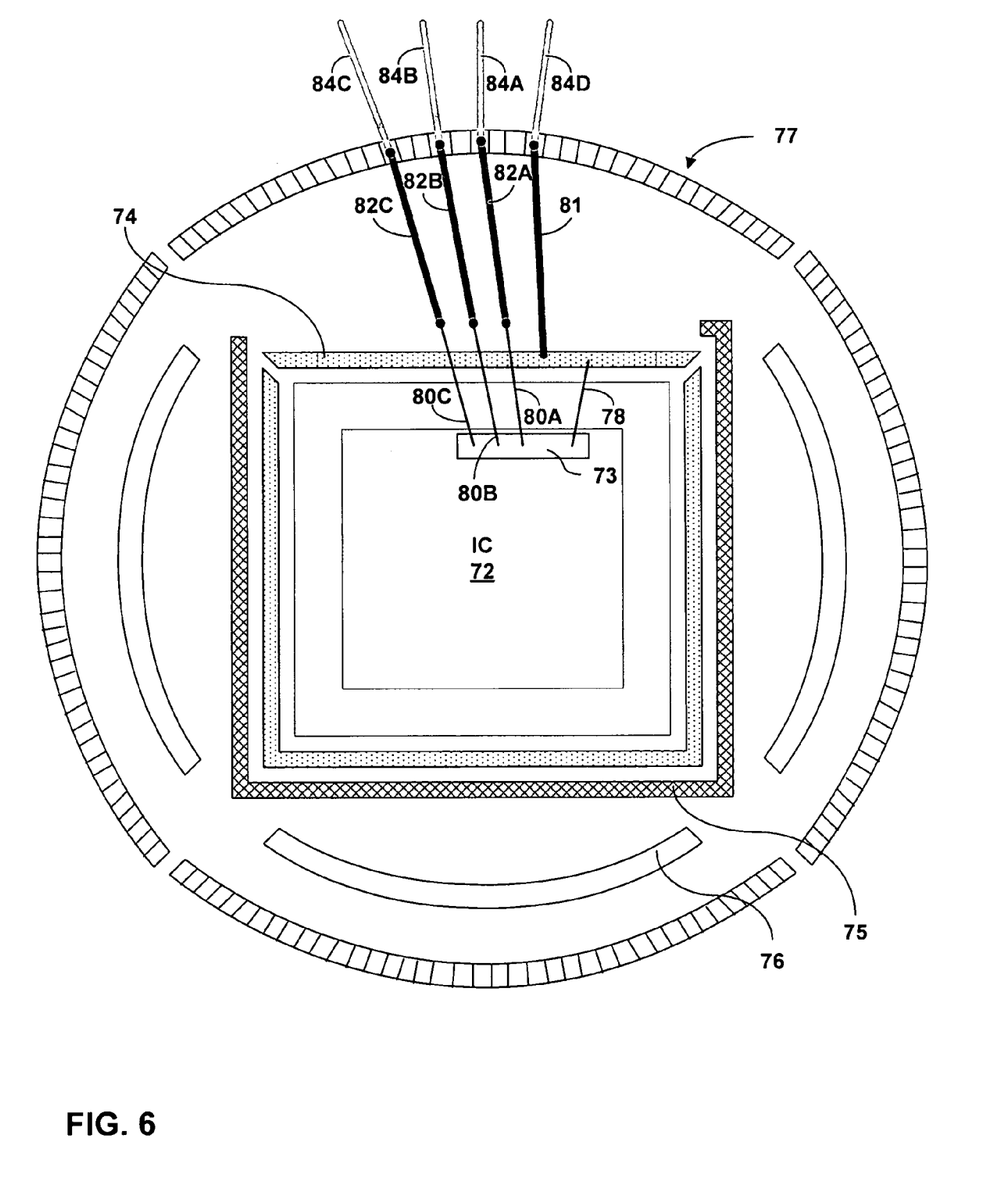
FIG. 6 is a wire bond diagram that illustrates exemplary connections of an IC mounted on a BGA package in accordance with an embodiment of the invention.

FIG. 6 is a wire bond diagram that illustrates exemplary connections of an IC 72 mounted on a BGA package in accordance with an embodiment of the invention. IC 72 is mounted near a center of the BGA package. IC 72 may comprise a control circuit for an electronic device, such as a disk drive. IC 72 includes an analog circuit 73, which may comprise a serial transceiver. Only wire bond connections to analog circuit 73 are shown in FIG. 6. However, a plurality of wire bonds external to analog circuit 73 couple IC 72 to contacts on the BGA package.

The BGA package comprises a set of contacts 77 disposed near an edge of the BGA package. The set of contacts 77 may be capable of receiving I/O signal lines, high-speed differential signal lines, isolated power lines, and isolated ground lines. The BGA package of the illustrated embodiment comprises a ground ring 74 that substantially completely surrounds IC 72. The BGA package also comprises a first power strip 75, and a second power strip 76 disposed between ground ring 74 and the set of contacts 77 on at least one side of IC 72. As shown in FIG. 6, first power strip 75 and second power strip 76 extend around three of the four sides of IC 72. First power strip 75 may comprise a voltage level different than a voltage level of second power strip 76. For example, first power strip 75 may comprise a 1.8 volt power strip and second power strip 76 may comprise a 3.3 volt power strip.

The region of the BGA package that does not include first power strip 75 or second power strip 76 is located substantially adjacent analog circuit 73 of IC 72. This region may be considered an analog area of the BGA package. In general, wire bonds connect analog circuit 73 of IC 72 to traces extended from the set of contacts 77 into the analog area. The traces connect the wire bonds to the set of contacts 77, and in turn connect the set of contacts 77 to solder balls on an opposite surface of the BGA package. The solder balls of the BGA package are connected to contacts on a PCB, thereby electrically coupling IC 72 to the PCB. The PCB contacts connect the BGA package to ground planes, power planes, and signal planes within the PCB. Although not shown in FIG. 6, wire bonds outside of the analog area of the BGA package couple IC 72 to ground ring 74, power strips 75 and 76, and the set of contacts 77.

Analog circuit 73 of IC 72 requires isolated power and ground connections to avoid introducing noise from other circuits on IC 72 into analog circuit 73. As discussed above with respect to the prior art BGA package illustrated in FIG. 4, wire bonds of length necessary to couple analog circuit 73 to the set of contacts 77 include excess parasitic inductance. The excess parasitic inductance within wire bonds may affect signal quality, signal edge rates, and noise levels on IC 72. In order to reduce the amount of inductance, the invention utilizes shortened wire bonds by extending traces from the set of contacts 77 inward into the BGA package toward IC 72.

Wire bonds 80A-80C ("wire bonds 80") couple analog circuit 73 of IC 72 to traces 82A-82C ("traces 82"). Traces 82 may comprise signal traces or power traces. In addition, wire bond 78 couples analog circuit 73 to ground ring 74 and ground trace 81 extends from one of contacts 77 inward into the BGA package to ground ring 74. Wire bonds 80 may comprise lengths of less than approximately 90 mils, more preferably less than approximately 80 mils. Signal traces 82 may comprise lengths between approximately 280 mils and 380 mils.

The set of contacts 77 receive lines 84A-84D ("lines 84") from other components on the PCB. For example, lines 84A and 84B may comprise high-speed differential signal lines, line 84C may comprise an isolated power line, and line 84D may comprise an isolated ground line. Continuing the example, traces 82A and 82B may therefore comprise signal traces that transmit high-speed differential signals, such as Fiber Channel signals, between signal lines 84A and 84B and wire bonds 80A and 80B, respectively. Trace 82C may comprise a power trace that carries isolated power between isolated power line 84C and wire bond 80C. Finally, ground trace 81 couples isolated ground line 84D to ground ring 74 to which wire bond 78 is coupled.

Reducing the length of wire bonds 80 that transmit isolated power to analog circuit 73 substantially reduces an amount of inductance within the wire bond, which reduces noise on IC 72. Reducing the length of wire bonds 80 that transmit high-speed differential signals to and from analog circuit 73 substantially reduces the length and magnitude of inductive discontinuity between the BGA package and IC 72, which improves signal integrity. In this way, the invention facilitates successful transmission of high-speed differential signals over a BGA package at 4.25 Gbit/s and above.

Figure 7:
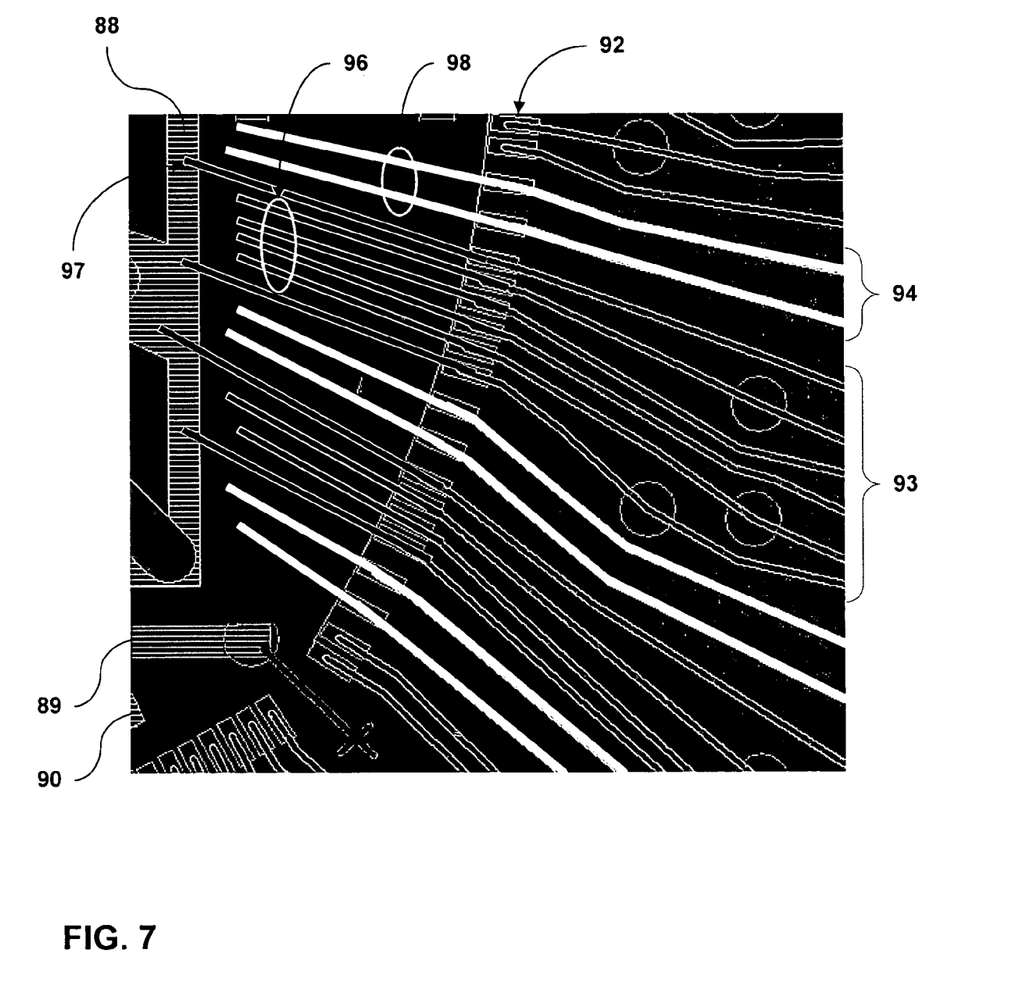
FIG. 7 illustrates a portion of a BGA package in accordance with an embodiment of the invention.

FIG. 7 illustrates a portion of a BGA package in accordance with an embodiment of the invention. The illustrated BGA package comprises a ground ring 88, a first power strip 89, a second power strip 90, and a set of contacts 92. In the illustrated embodiment, the portion of the BGA package comprises an analog area of the BGA package substantially adjacent an analog circuit included in an IC (not shown) mounted on the BGA package.

A subset of contacts 92 receive high-speed differential signal lines 94 and another subset of contacts 92 receive isolated power and ground lines 93. Lines 93 may also comprise other I/O signal lines. Traces extend from the set of contacts 92 inward into the analog area of the BGA package toward the IC mounting on the BGA package. As can be seen in FIG. 7, first power strip 89 and second power strip 90 are not included in the analog area of the BGA package, which enables the traces to extend into the now vacant region.

Signal traces 98 extend from the subset of contacts 92 that receive high-speed differential signal lines. Wire bonds (not shown) are used to connect signal traces 98 to the analog circuit of the IC mounted on the BGA package, thereby electrically coupling the subset of contacts 92 to the IC. Power traces 96 extend from the subset of contacts 92 that receive isolated power lines 93. Wire bonds are used to connect power traces 96 to the analog circuit of the IC mounted on the BGA package, thereby electrically coupling the subset of contacts 92 to the IC. Finally, ground traces 97 extend from the subset of contacts 92 that receive ground lines 93 to ground ring 88 of the BGA package. Wire bonds couple the ground ring 88 to the analog circuit, thereby electrically coupling the subset of contacts 92 to the IC.

Figure 8:
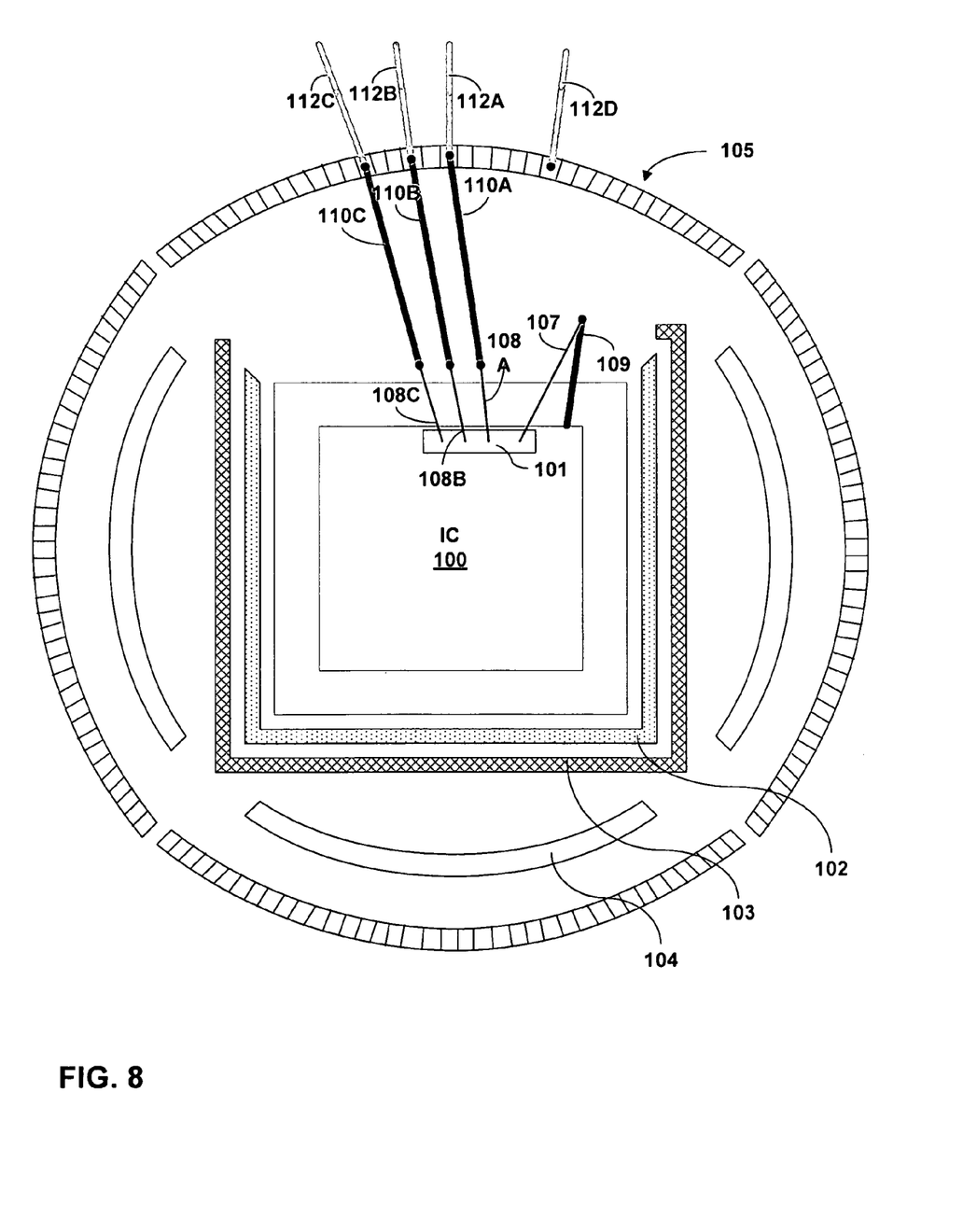
FIG. 8 is a wire bond diagram that illustrates exemplary connections of an IC mounted on a BGA package in accordance with another embodiment of the invention.

FIG. 8 is a wire bond diagram that illustrates exemplary connections of an IC 100 mounted on a BGA package in accordance with another embodiment of the invention. IC 100 is mounted near a center of the BGA package. IC 100 may comprise a control circuit for an electronic device, such as a disk drive. IC 100 includes an analog circuit 101, which may comprise a serial transceiver. Only wire bond connections to analog circuit 101 are shown in FIG. 8. However, a plurality of wire bonds external to analog circuit 101 couple IC 100 to contacts on the BGA package.

The BGA package comprises a set of contacts 105 disposed near an edge of the BGA package. The set of contacts 105 may be capable of receiving I/O signal lines, high-speed differential signal lines, isolated power lines, and isolated ground lines. The BGA package of the illustrated embodiment comprises a ground strip 102 disposed near at least one side of IC 100. The BGA package also comprises a first power strip 103 and a second power strip 104 disposed between ground strip 102 and the set of contacts 105 on at least one side of IC 100. As shown in FIG. 8, ground strip 102, first power strip 103, and second power strip 104 extend around three of the four sides of IC 100. First power strip 103 may comprise a voltage level different than a voltage level of second power strip 104. For example, first power strip 103 may comprise a 1.8 volt power strip and second power strip 104 may comprise a 3.3 volt power strip.

The region of the BGA package that does not include ground strip 102, first power strip 103, or second power strip 104 is located substantially adjacent analog circuit 101 of IC 100. This region may be considered an analog area of the BGA package. In general, wire bonds connect analog circuit 101 of IC 100 to traces extended from the set of contacts 105 into the analog area. The traces connect the wire bonds to the set of contacts 105, and in turn connect the set of contacts 105 to solder balls on an opposite surface of the BGA package. The solder balls of the BGA package are connected to contacts on a PCB, thereby electrically coupling IC 100 to the PCB. The PCB contacts connect the BGA package to ground planes, power planes, and signal planes within the PCB. Although not shown in FIG. 8, wire bonds outside of the analog area of the BGA package couple IC 100 to ground strip 102, power strips 103 and 104, and the set of contacts 105.

Analog circuit 101 of IC 100 requires isolated power and ground connections to avoid introducing noise from other circuits on IC 100 into analog circuit 101. As discussed above with respect to the prior art BGA package illustrated in FIG. 4, wire bonds of length necessary to couple analog circuit 101 to the set of contacts 105 include excess parasitic inductance. The excess parasitic inductance within wire bonds may affect signal quality, signal edge rates, and noise levels on IC 100. In order to reduce the amount of inductance, the invention utilizes shortened wire bonds by extending traces from the set of contacts 105 inward into the BGA package toward IC 100.

Wire bonds 108A-108C ("wire bonds 108") couple analog circuit 101 of IC 100 to traces 110A-110C ("traces 110"). Traces 110 may comprise signal traces or power traces. Wire bonds 108 may comprise lengths of less than 70 mils, more preferably approximately 60 mils. Signal traces 110 may comprise lengths between approximately 300 mils and 400 mils. In addition, a ground trace 109 extends outward from IC 100 into the BGA package toward the set of contacts 105. Ground trace 109 connects to a ground beneath IC 100. A wire bond 107 couples analog circuit 101 to ground trace 109.

The set of contacts 105 receive lines 112A-112D ("lines 112") from other components on the PCB. For example, lines 112A and 112B may comprise high-speed differential signal lines, line 112C may comprise an isolated power line, and line 112D may comprise an isolated ground line. Continuing the example, traces 110A and 110B may therefore comprise signal traces that transmit high-speed differential signals, such as Fiber Channel signals, between signal lines 112A and 112B and wire bonds 108A and 108B, respectively. Trace 110C may comprise a power trace that carries isolated power between isolated power line 112C and wire bond 108C. Finally, wire bond 107 couples isolated ground trace 109 to analog circuit 101 of IC 100.

Reducing the length of wire bonds 108 that transmit isolated power to analog circuit 101 substantially reduces an amount of inductance within the wire bond, which reduces noise on IC 100. Reducing the length of wire bonds 108 that transmit high-speed differential signals to and from analog circuit 101 substantially reduces the length and magnitude of inductive discontinuity between the BGA package and IC 100, which improves signal integrity. In this way, the invention facilitates successful transmission of high-speed differential signals over a BGA package at 4.25 Gbit/s and above.

Figure 9:
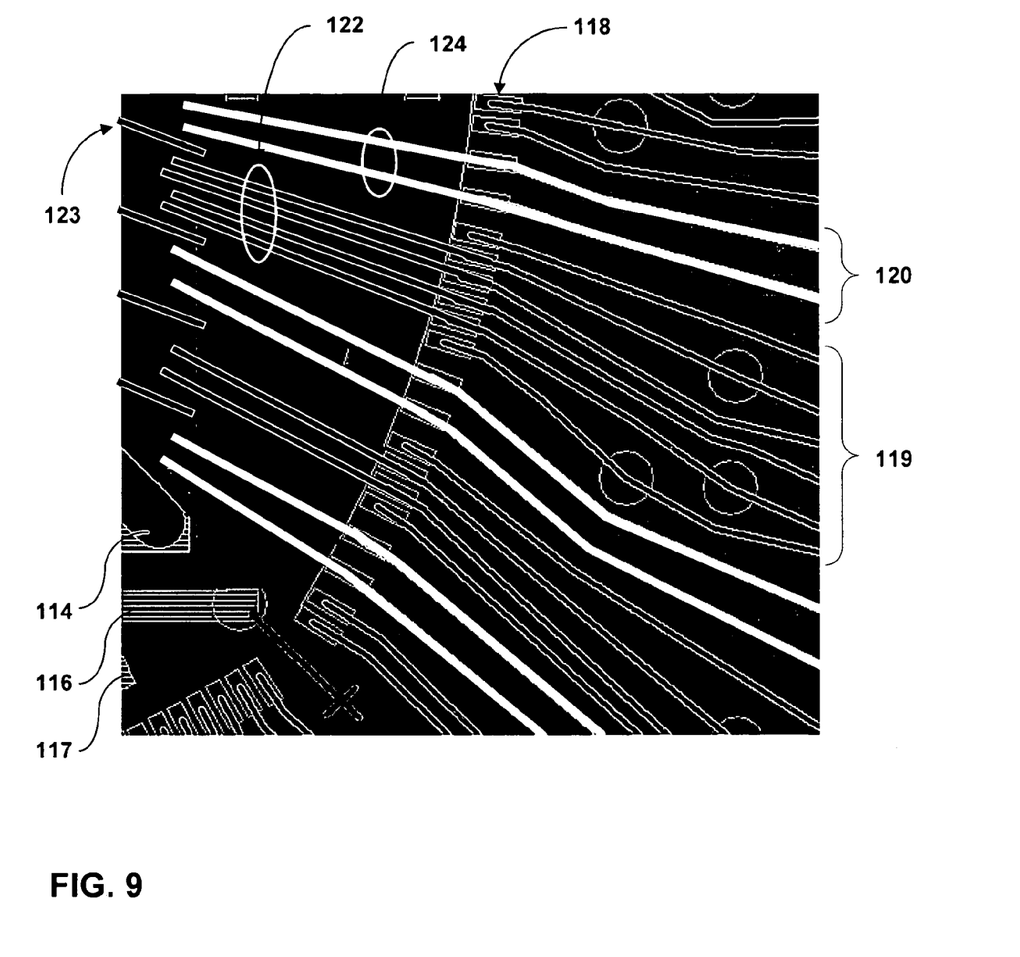
FIG. 9 illustrates a portion of a BGA package in accordance with another embodiment of the invention.

FIG. 9 illustrates a portion of a BGA package in accordance with another embodiment of the invention. The illustrated BGA package comprises a ground strip 114, a first power strip 116, a second power strip 117, and a set of contacts 118. In the illustrated embodiment, the portion of the BGA package comprises an analog area of the BGA package substantially adjacent an analog circuit included in an IC (not shown) mounted on the BGA package.

A subset of contacts 118 receive high-speed differential signal lines 120 and another subset of contacts 118 receive isolated power and ground lines 119. Lines 119 may also comprise other I/O signal lines. Traces extend from the set of contacts 118 inward into the analog area of the BGA package toward the IC mounting on the BGA package. As can be seen in FIG. 9, ground strip 114, first power strip 116, and second power strip 117 are not included in the analog area of the BGA package, which enables the traces to extend into the now vacant region.

Signal traces 124 extend from the subset of contacts 118 that receive high-speed differential signal lines 120. Wire bonds (not shown) are used to connect signal traces 124 to the analog circuit of the IC mounted on the BGA package, thereby electrically coupling the subset of contacts 120 to the IC. Power traces 122 extend from the subset of contacts 118 that receive isolated power lines 119. Wire bonds are used to connect power traces 122 to the analog circuit of the IC mounted on the BGA package, thereby electrically coupling the subset of contacts 118 to the IC. Finally, ground traces 123 extend from a ground of the IC outward into the BGA package toward the set of contacts 118. Wire bonds couple ground traces 123 to a ground of the analog circuit of the IC mounted in the BGA package.

Various embodiments of the invention have been described. For example, techniques have been described for reducing inductance within wire bonds that couple an IC mounted on a BGA package to the BGA package. Conventional wire bonds that couple a set of contacts disposed near an edge of a BGA package to the IC mounted on the BGA package are relatively long and include excess parasitic inductance. The techniques include reducing lengths of the wire bonds by extending traces from the set of contacts inward into the BGA package toward the IC. This may be accomplished by removing a portion of the power rings, and in some cases a portion of the ground ring, included within the BGA package. The portions of the rings may be removed from regions of the BGA package that do not utilize the power and ground rings, such as analog areas that require isolated power and ground connections. The BGA package may be particularly useful for disk drive applications, but may also be useful for a wide variety of other circuits and devices. These and other embodiments are within the scope of the following claims.

The invention claimed is:

1. A system comprising:
a printed circuit board;
a ball grid array package coupled to the printed circuit board; and
an integrated circuit having four sides mounted on the ball grid array package, wherein the integrated circuit comprises a control circuit for a hard disk drive;
wherein the ball grid array package includes a set of contacts disposed near an outer edge of the ball grid array package, a power strip disposed in a region of the ball grid array package along a proximity of and entirely surrounding three of four sides of the integrated circuit such that a region in a proximity along a side of the integrated circuit excludes the power strip, signal traces that extend from a subset of the contacts inward into the region of the ball grid array package excluding the power strip toward the integrated circuit, and wire bonds that couple the signal traces to the integrated circuit to thereby electrically couple the subset of the contacts to the integrated circuit, wherein the presence of the signal traces substantially reduces lengths of the wire bonds relative to wire bonds that couple the set of contacts directly to the integrated circuit, and the integrated circuit includes at least one analog circuit disposed along the side of the integrated circuit adjacent to the region excluding the power strip, and the wire bonds electrically couple the subset of contacts to the analog circuit.

2. The system of claim 1, wherein the ball grid array package comprises solder balls that couple the ball grid array package to the printed circuit board, wherein the signal traces couple the subset of the contacts to the solder balls to thereby electrically couple the integrated circuit to the printed circuit board.

* * * * *